United States Patent
Girdhar

(10) Patent No.: US 9,036,442 B2
(45) Date of Patent: May 19, 2015

(54) REDUCED-NOISE REFERENCE VOLTAGE PLATFORM FOR A VOLTAGE CONVERTER DEVICE

(75) Inventor: Dev Alok Girdhar, Indialantic, FL (US)

(73) Assignee: Intersil Americas LLC, Milpitas, CA (US)

( * ) Notice: Subject to any disclaimer, the term of this patent is extended or adjusted under 35 U.S.C. 154(b) by 503 days.

(21) Appl. No.: 13/538,697

(22) Filed: Jun. 29, 2012

(65) Prior Publication Data
US 2014/0003179 A1 Jan. 2, 2014

(51) Int. Cl.
G11C 5/14 (2006.01)
H01L 23/495 (2006.01)
H01L 23/50 (2006.01)

(52) U.S. Cl.
CPC .......... *H01L 23/49575* (2013.01); *H01L 23/50* (2013.01); *H01L 2224/32245* (2013.01); *H01L 2224/48137* (2013.01); *H01L 2224/73265* (2013.01); *H01L 23/49524* (2013.01); *H01L 23/49562* (2013.01)

(58) Field of Classification Search
CPC .............................. G11C 11/4074; G11C 5/147
USPC ................................ 365/226, 63, 189.09, 206
See application file for complete search history.

(56) References Cited

U.S. PATENT DOCUMENTS

| 5,297,079 | A  | * | 3/1994 | Ha ................................. 365/205 |
| 6,255,141 | B1 |   | 7/2001 | Singh et al. |
| 6,301,180 | B1 | * | 10/2001 | Sudo et al. .................... 365/207 |
| 2005/0023674 | A1 |   | 2/2005 | Kang et al. |
| 2007/0090522 | A1 |   | 4/2007 | Alhayek et al. |

* cited by examiner

*Primary Examiner* — Tuan T Nguyen
(74) *Attorney, Agent, or Firm* — Fogg & Powers LLC

(57) ABSTRACT

An electronic system, a reduced-noise reference voltage platform for a voltage converter device, and a method of manufacture of a reduced-noise reference voltage platform for a voltage converter device are disclosed. For example, the reduced-noise reference voltage (e.g., ground) platform includes a first conductor unit, a second conductor unit, and an insulator unit interposed between a first surface of the first conductor unit and a first surface of the second conductor unit. The reduced-noise reference voltage platform also includes a phase terminal connected to the first conductor unit, and a reference voltage (e.g., ground) terminal connected to the second conductor unit, wherein a second surface of the second conductor unit forms a platform coupled to the reference voltage (e.g., ground).

27 Claims, 3 Drawing Sheets

REDUCED-NOISE REFERENCE VOLTAGE PLATFORM FOR A VOLTAGE CONVERTER DEVICE

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
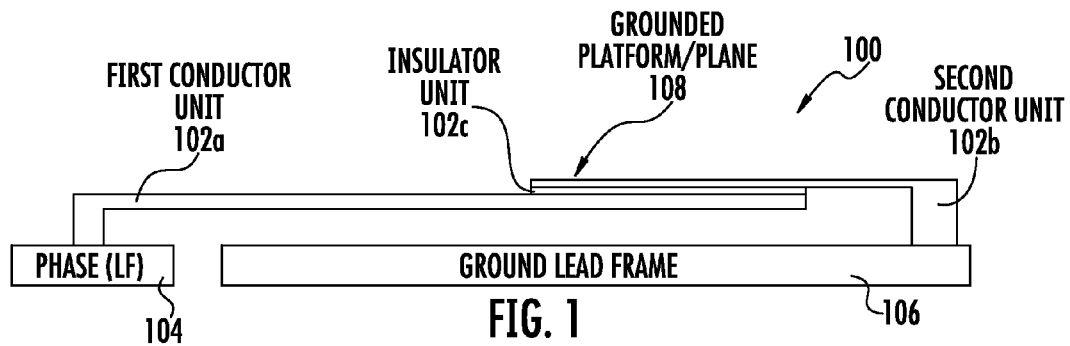
FIG. 1 is a side-elevation, cross-sectional view of a reduced-noise reference voltage platform for a voltage converter device, in accordance with a first embodiment of the present invention.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part thereof, and in which are shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual acts may be performed. The following detailed description is, therefore, not to be construed in a limiting sense.

Essentially, a reduced-noise reference voltage platform or plane is provided for a noise-sensitive driver/controller in, for example, a stacked semiconductor voltage converter device. For ease of description, embodiments in the remainder of the detailed description describe the term "reference voltage" in terms of a ground potential. However, it is understood that the present invention is not limited to a ground potential, and other reference potentials or voltages are contemplated and can be used in specific implementations. For example, in one exemplary embodiment, a first component of the reduced-noise reference voltage (e.g., ground) platform conducts the current from the source of a high-side transistor and the drain of a low-side transistor to a phase output lead frame. A second component of the reduced-noise reference voltage platform insulates the phase output terminal (e.g., lead frame) from a reference voltage (e.g., ground) lead frame of the voltage converter device. The reference voltage (e.g., ground) lead frame is connected to a third component of the reduced-noise reference voltage platform. As such, the third component provides a reduced-noise, e.g., grounded, structural platform or plane for a driver/controller (or one or more other components) of the voltage converter device involved.

FIG. 1 is a side-elevation, cross-sectional view of a reduced-noise reference voltage (e.g., ground) platform 100 for a voltage converter device, in accordance with a first exemplary embodiment of the present invention. Referring to FIG. 1, the reduced-noise (e.g., ground potential) platform 100 includes a first conductor unit 102a, a second conductor unit 102b, and an insulator unit 102c. The insulator unit 102c is a layer of a suitable insulation material that is sandwiched or interposed between a first (e.g., upper) surface of first conductor unit 102a and a second (e.g., lower) surface of second conductor unit 102b. In one exemplary embodiment, first conductor unit 102a and second conductor unit 102b are formed as separate components using a suitable electrically-conductive metal material, such as, for example, copper or aluminum. In some embodiments, each one of the first conductor unit 102a and the second conductor unit 102b can be formed in an L-shape, and also should be rigid and strong enough to support the weight of the component(s) of the voltage converter device (e.g., driver/controller) to be used. Also, the second conductor unit 102b should be wide enough to encompass the width (or footprint) of the voltage converter component(s) used. The insulator unit 102c is formed using a suitable electrical insulation material, such as, for example, quartz or glass. The insulator unit 102c can be approximately 0.1 μm to approximately 10,000 μm thick. For example, in one embodiment, the insulator unit 102c can be approximately 100 μm thick. The insulator unit 102c is permanently affixed to the first surface of the first conductor unit 102a and the second surface of the second conductor unit 102b using a suitable adhesive material, such as, for example, an epoxy. Note that although exemplary metallic, insulation and adhesive materials are described herein to form reduced-noise reference voltage (e.g., ground) platform 100, the scope of the present invention is not intended to be so limited. Any suitable metallic, insulation or adhesive material or technique that can be used effectively in a semiconductor voltage converter device manufacturing process can be used to form the above-described components of the reduced-noise reference voltage (e.g., ground) platform 100.

As shown in FIG. 1, the first conductor unit 102a of reduced-noise reference voltage (e.g., ground) platform 100 is connected at one end using, for example, a suitable metal connection material (such as solder) to a phase output terminal 104 of the power stage of the voltage converter device, and the second conductor unit 102b of the reduced-noise reference voltage (e.g., ground) platform 100 is connected at the other end (e.g., using solder) to the reference voltage (e.g., ground) lead frame 106 of the voltage converter device involved. Therefore, in operation, and as described in more detail below, the reduced-noise reference voltage (e.g., ground) platform 100 insulates the phase output terminal 104 from the reference voltage (e.g., ground) lead frame 106 of the voltage converter device, and the second (e.g., upper) surface of the second conductor unit 102b provides a (e.g., grounded) structural platform or plane 108 for one or more components of the voltage converter device.

Figure 2:
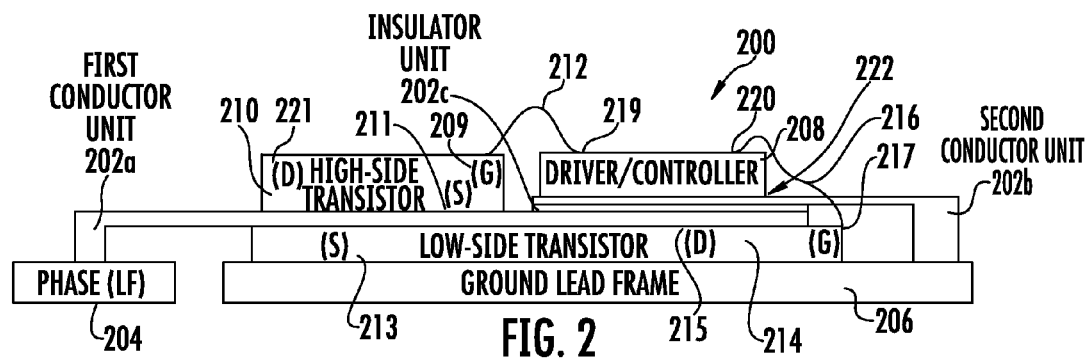
FIG. 2 is a side-elevation, cross-sectional view of a reduced-noise reference voltage platform for a voltage converter device, in accordance with a second embodiment of the present invention.

FIG. 2 is a side-elevation, cross-sectional view of a reduced-noise reference voltage (e.g., ground) platform 200 for a voltage converter device, in accordance with a second exemplary embodiment of the present invention. Referring to FIG. 2, the reduced-noise ground platform 200 includes a first conductor unit 202a, a second conductor unit 202b, and an insulator unit 202c. The insulator unit 202c is a layer of a suitable insulation material that is sandwiched or interposed between a first (e.g., upper) surface of first conductor unit 202a and a second (e.g., lower) surface of second conductor unit 202b. For example, in one embodiment, first conductor unit 202a and second conductor unit 202b can be formed as separate components using a suitable electrically-conductive metal material, such as copper or aluminum. The insulator unit 202c is formed using a suitable electrical insulation material, such as, for example, quartz or glass. The insulator unit 202c is permanently affixed to the first surface of the first conductor unit 202a and the second surface of the second conductor unit 202b using a suitable adhesive material (e.g., an epoxy). Note that although exemplary metallic, insulation and adhesive materials are described herein to form reduced-noise ground platform 200, the scope of the present invention is not intended to be so limited. Any suitable metallic, insulation or adhesive material or technique that can be used effectively in a semiconductor voltage converter device manufacturing process can be used to form the above-described components of the reduced-noise ground platform 200. In any event, the first conductor unit 202a of the reduced-noise ground platform 200 is connected at one end (e.g., using a suitable metal connection technique) to the phase output terminal 204 of the power stage of the voltage converter device, and the second conductor unit 202b of the reduced-noise ground platform 200 is connected at the other end (e.g., using a suitable metal connection technique) to the ground lead frame 206 of the voltage converter device involved.

In this exemplary embodiment, a semiconductor driver/controller 208 (e.g., die) is formed on a second (e.g., upper) surface of second conductor unit 202b. The substrate layer of the driver/controller 208 is at circuit ground (reference potential) and affixed to the second surface of second conductor unit 202b. Consequently, since the second conductor unit 202b is electrically connected to the ground lead frame 206, the second conductor unit 202b forms a grounded platform or plane for driver/controller 208.

A high-side transistor 210 is formed on a second (e.g., upper) surface of first conductor unit 202a. For example, the high-side transistor 210 can be a Field-Effect Transistor (FET), such as a lateral diffused metal-oxide semiconductor (LDMOS) FET or other suitable transistor device. Note that (as described in more detail below with respect to FIG. 3) the source 211 of the high-side transistor 210 is formed on the second (upper) surface of the first conductor unit 202a. A first lead wire 212 electrically connects the gate 209 of the high-side transistor 210 to a first driver output connection 219 of the driver/controller 208. The drain 221 of the high-side transistor 210 can be coupled to a Vin lead frame of the power stage involved using, for example, a suitable metal interconnection material or technique (e.g., a wire-bond connection).

A low-side transistor 214 is formed on the upper surface of the ground lead frame 206. The low-side transistor 214 can also be a FET, such as, for example, a LDMOS transistor device. Note that (as described in detail below with respect to FIG. 3) the source connection 213 of the low-side transistor 214 is formed on the upper surface of ground lead frame 206. Also, the drain connection 215 of the low-side transistor 214 is formed on the first (lower) surface of the first conductor unit 202a. In other words, the low-side transistor 214 and the high-side transistor 210 are oriented so that their respective drains (and gates) are arranged at or near the tops of the devices, and their respective sources are arranged at or near the bottoms of the devices. As such, the source 211 of the high-side transistor 210 and the drain 215 of the low-side transistor 214 are connected to the phase output terminal 204 of the power stage of the voltage converter device via the first conductor unit 202a. A second lead wire 216 electrically connects the gate 217 of the low-side transistor 214 to a second driver output connection 220 of the driver/controller 208.

In operation, the first conductor unit 202a conducts the current from the source of the high-side transistor 210 and the drain of the low-side transistor 214 to the phase output lead frame 204. Also, the reduced-noise ground platform 200 insulates the phase output terminal 204 from the ground lead frame 206 of the voltage converter device, and the second (e.g., upper) surface of the second conductor unit 202b thus provides a reduced-noise grounded, structural platform or plane 222 for the driver/controller 208 (or, for example, one or more other components of the voltage converter device involved.

Figure 3:
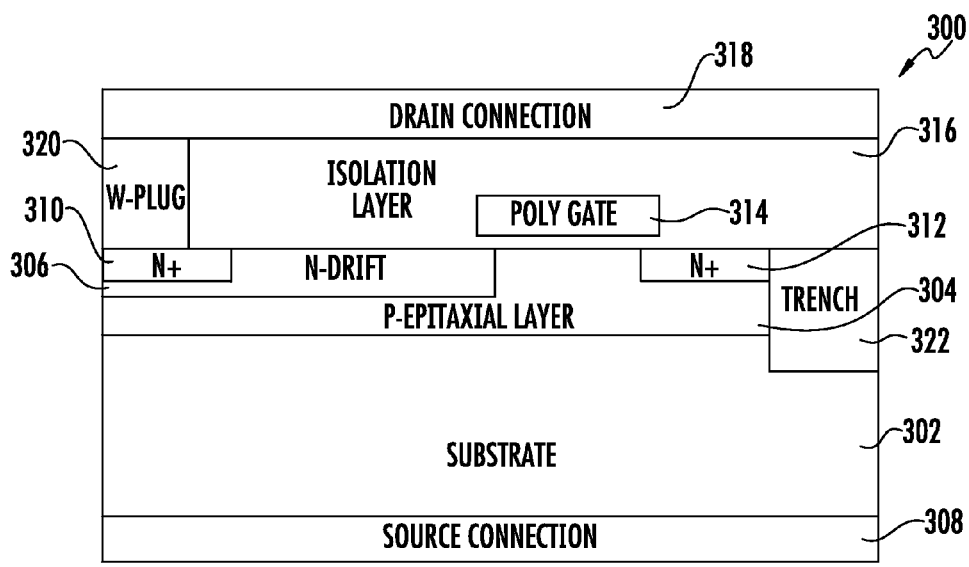
FIG. 3 is a side-elevation, cross-sectional view of an exemplary semiconductor device, which can be utilized to form the high-side transistor or the low-side transistor shown in FIG. 2.

FIG. 3 is a side-elevation, cross-sectional view of an exemplary semiconductor device 300, which can be utilized to form the high-side transistor 210 or the low-side transistor 214 shown in FIG. 2. In one embodiment, the semiconductor device 300 can be a LDMOS transistor device, such as a lateral N-channel DMOS (NDMOS) transistor device. However, note that any suitable transistor device that is oriented so that its drain and gate are arranged at or near its top, and its source is arranged at or near its bottom, can be used to implement semiconductor device 300 (also as shown in FIG. 2).

Referring to FIG. 3, for one exemplary embodiment, semiconductor device 300 includes a semiconductor substrate 302 doped to an N+conductivity (or alternatively, a P+ conductivity in a second embodiment) with a doping concentration of, for example, approximately 1E18 to 1E20 atoms/$cm^3$, and an epitaxial semiconductor layer 304 doped to a P-type conductivity with a doping concentration of, for example, approximately 1E14 to 1E18 atoms/$cm^3$. For example, epitaxial semiconductor layer 304 can be grown, deposited or attached to a first (e.g., upper) surface of semiconductor substrate 302. Semiconductor device 300 may also include an N-type drift region 306 with a doping concentration of, for example, approximately 1E14 to 1E17 atoms/$cm^3$. An N+ (or alternatively, P+ in a second embodiment) source layer 308 is formed (e.g., deposited) with a doping concentration of, for example, approximately 1E18 to 5E20 atoms/$cm^3$ on a second (e.g., lower) surface of semiconductor substrate 302. Also, a first N+ type region 310 is formed in N-type drift region 306, and a second N+ type well 312 is formed in epitaxial layer 304. For example, the first N+ type well 310 and the second N+ type region 312 can be formed with a depth of approximately 0.25 µm and a doping concentration of approximately 1E19 atoms/$cm^3$.

A conductive gate 314 is formed (e.g., using polysilicon) in an isolation layer 316 (e.g., using a suitable dielectric material), and a drain connection layer 318 is formed on the upper surface of the isolation layer 316. For example, the drain connection layer 318 can be formed by deposition of a suitable conductive material, such as Aluminum. A first conductive trench 320 including, for example, a Tungsten plug (W-plug), is formed in the isolation layer 316, and a second conductive trench 322 is formed in the P-type epitaxial layer 304 and the substrate 302. Note that, for this exemplary embodiment, the drain connection layer 318 is formed on the upper surface of the semiconductor device 300, the source connection layer 308 is formed on the lower surface of the semiconductor device 300, and the gate 314 is formed near the upper surface of the semiconductor device 300. Therefore, in one embodiment, the semiconductor device 300 can be used to form the high-side transistor 210 and the low-side transistor 214 shown in FIG. 2. However, note that although the semiconductor device shown in FIG. 3 can be utilized to implement the exemplary embodiment shown, the present invention is not intended to be limited to a specific configuration and can also be implemented with any suitable transistor device having the drain and gate connections arranged at or near the upper surface and its source connection arranged at or near the lower surface of the device.

Figure 4:
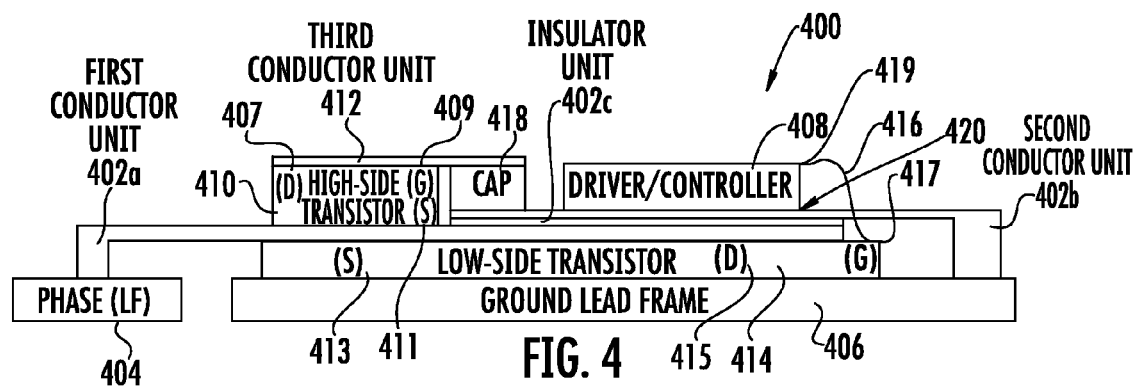
FIG. 4 is a side-elevation, cross-sectional view of a reduced-noise reference voltage platform for a voltage converter device, in accordance with a third exemplary embodiment of the present invention.

FIG. 4 is a side-elevation, cross-sectional view of a reduced-noise ground platform 400 for a voltage converter device, in accordance with a third exemplary embodiment of the present invention. Referring to FIG. 4, the reduced-noise ground platform 400 includes a first conductor unit 402a, a second conductor unit 402b, and an insulator unit 402c. The insulator unit 402c is a layer of a suitable insulation material sandwiched or interposed between a first (e.g., upper) surface of first conductor unit 402a and a second (e.g., lower) surface of second conductor unit 402b. For example, in one embodiment, first conductor unit 402a and second conductor unit 402b can be formed as separate components using a suitable electrically conductive material, such as copper or aluminum. The insulator unit 402c is formed using a suitable electrical insulation material, such as, for example, quartz or glass. The insulator unit 402c is permanently affixed to the first surface of the first conductor unit 402a and the second surface of the second conductor unit 402b using a suitable adhesive material (e.g., an epoxy). Note that although exemplary metallic, insulation and adhesive materials are described herein to form reduced-noise ground platform 400, the scope of the present invention is not intended to be so limited. Any suitable metallic, insulation or adhesive material or technique that can be used effectively in a semiconductor voltage converter device manufacturing process can be used to form the above-described components of the reduced-noise ground platform 400. In any event, the first conductor unit 402a of the reduced-noise ground platform 400 is connected at one end (e.g., using a suitable metal connection technique) to the phase output terminal 404 of the power stage of the voltage converter device, and the second conductor unit 402b of the reduced-noise ground platform 400 is connected at the other end (e.g., using a suitable metal connection technique) to the ground lead frame 406 of the voltage converter device involved.

In this exemplary embodiment, a semiconductor driver/controller 408 is formed on a second (e.g., upper) surface of second conductor unit 402b. The substrate layer of the driver/controller 408 is at circuit ground and affixed to the second surface of second conductor unit 402b. Consequently, since the second conductor unit 402b is electrically connected to the ground lead frame 406, the second conductor unit 402b forms a grounded platform or plane for driver/controller 408.

A high-side transistor 410 is formed on a second (e.g., upper) surface of first conductor unit 402a. For example, the high-side transistor 410 can be a FET, such as a LDMOS FET or other suitable transistor device. Note that (as described in detail above with respect to FIG. 3) the source 411 of the high-side transistor 410 is formed on the second (upper) surface of the first conductor unit 402a. A third conductor unit 412 (e.g., using a metal clip made of copper or aluminum) is formed on an upper surface of high-side transistor 410 and an upper surface of a capacitor 418. As such, the third conductor unit 412 electrically connects the drain 407 of the high-side transistor 410 to a first terminal portion of capacitor 418. The second terminal portion of the capacitor 418 is formed on the second surface of second conductor unit 402b and is electrically connected to the ground lead frame 406. Also, the drain 407 of the high-side transistor 410 can be coupled to a Vin lead frame of the power stage involved using, for example, a suitable metal interconnection material or technique (e.g., a wire-bond connection or an extension of the third conductor unit 412).

A low-side transistor 414 is attached to the upper surface of the ground lead frame 406. The low-side transistor 414 can also be a FET, such as, for example, a LDMOS transistor device. Note that (as described in detail above with respect to FIG. 3) the source connection 413 of the low-side transistor 414 is formed on the upper surface of ground lead frame 406. Also, the drain connection 415 of the low-side transistor 414 is formed on the first (lower) surface of the first conductor unit 402a. In other words, the low-side transistor 414 and the high-side transistor 410 are oriented so that their respective drain (and gate) connections are arranged at or near the tops of the devices, and their respective source connections are arranged at or near the bottoms of the devices. As such, the source 411 of the high-side transistor 410 and the drain 415 of the low-side transistor 414 are connected to the phase output terminal 404 of the power stage of the voltage converter device via the first conductor unit 402a. A lead wire 416 (e.g., wire-bond connection) may electrically connect the gate 417 of the low-side transistor 414 to a driver output connection 419 of the driver/controller 408. Also, a wire-bond connection can be used to electrically connect the gate 409 of the high-side transistor 410 to a second driver output connection of the driver/controller 408.

In operation, the first conductor unit 402a conducts the current from the source 411 of the high-side transistor 410 and the drain 415 of the low-side transistor 414 to the phase output terminal or lead frame 404. Also, the reduced-noise ground platform 400 insulates the phase output terminal 404 from the ground lead frame 406 of the voltage converter device, and the second (e.g., upper) surface of the second conductor unit 402b thus provides a reduced-noise grounded, structural platform or plane 420 for the driver/controller 408 (or, for example, one or more other components) of the voltage converter device involved. Additionally, in this exemplary embodiment, the capacitor 418 provides additional noise reduction between the Vin terminal and ground, because the capacitor 418 is disposed in the reduced-noise ground platform next to the drain 407 of the high-side transistor 410 (connected to Vin via third conductor unit 412) and the source 413 of the low-side transistor 406 (connected to ground via second conductor unit 402b).

Figure 5:
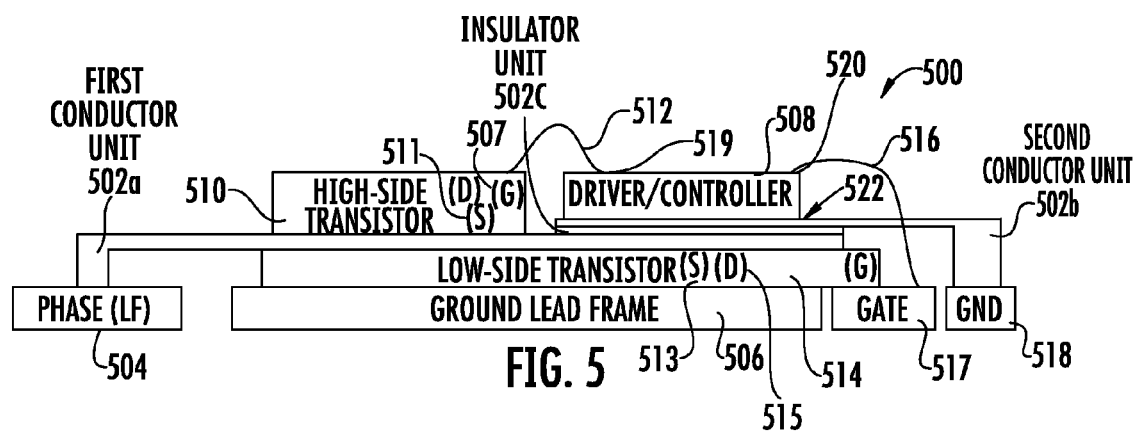
FIG. 5 is a side-elevation, cross-sectional view of a reduced-noise reference voltage platform for a voltage converter device, in accordance with a fourth exemplary embodiment of the present invention.

FIG. 5 is a side-elevation, cross-sectional view of a reduced-noise ground platform 500 for a voltage converter device, in accordance with a fourth exemplary embodiment of the present invention. Referring to FIG. 5, the reduced-noise ground platform 500 includes a first conductor unit 502a, a second conductor unit 502b, and an insulator unit 502c. The insulator unit 502c is a layer of a suitable insulation material that is sandwiched or interposed between a first (e.g., upper) surface of first conductor unit 502a and a second (e.g., lower) surface of second conductor unit 502b. For example, in one embodiment, first conductor unit 502a and second conductor unit 502b can be formed as separate components using a suitable electrically-conductive metal material, such as copper or aluminum. The insulator unit 502c is formed suing a suitable electrical insulation material, such as, for example, quartz or glass. The insulator unit 502c is permanently affixed to the first surface of the first conductor unit 502a and the second surface of the second conductor unit 502b using a suitable adhesive material (e.g., an epoxy). Note that although exemplary metallic, insulation and adhesive materials are described herein to form noise free ground platform 500, the scope of the present invention is not intended to be so limited. Any suitable metallic, insulation or adhesive material or technique that can be use effectively in a semiconductor voltage converter device manufacturing process can be used to form the above-described components of the reduced-noise ground platform 500. In any event, the first conductor unit 502a of the reduced-noise ground platform 500 is connected at one end (e.g., using a suitable metal connection technique) to the phase output terminal 504 of the power stage of the voltage converter device, and the second conductor unit 502b of the reduced-noise ground platform 500 is connected at the other end (e.g., using a suitable metal connection technique) to a ground terminal (lead frame) 518 of the voltage converter device involved. For example, the ground terminal 518 can be an extension of ground lead frame 506 or a separate lead frame.

In this exemplary embodiment, a semiconductor driver/controller 508 is formed on a second (e.g., upper) surface of second conductor unit 502b. The substrate layer of the driver/controller 508 is at circuit ground and affixed to the second surface of second conductor unit 502b. Consequently, since the second conductor unit 502b is electrically connected to the ground terminal 518, the second conductor unit 502b forms a grounded platform or plane for driver/controller 508.

A high-side transistor 510 is attached to a second (e.g., upper) surface of first conductor unit 502a. For example, the high-side transistor 510 can be a FET, such as a LDMOS FET or other suitable transistor device. Note that (as described in detail above with respect to FIG. 3) the source connection 511 of the high-side transistor 510 is formed on the second (upper) surface of the first conductor unit 502a. A first lead wire 512 may electrically connect the gate 507 of the high-side transistor 510 to a first driver output connection 519 of the driver/controller 508. The drain of the high-side transistor 510 can be coupled to a Vin lead frame of the power stage involved using, for example, a suitable metal interconnection material or technique (e.g., a wire-bond connection).

Figure 7:
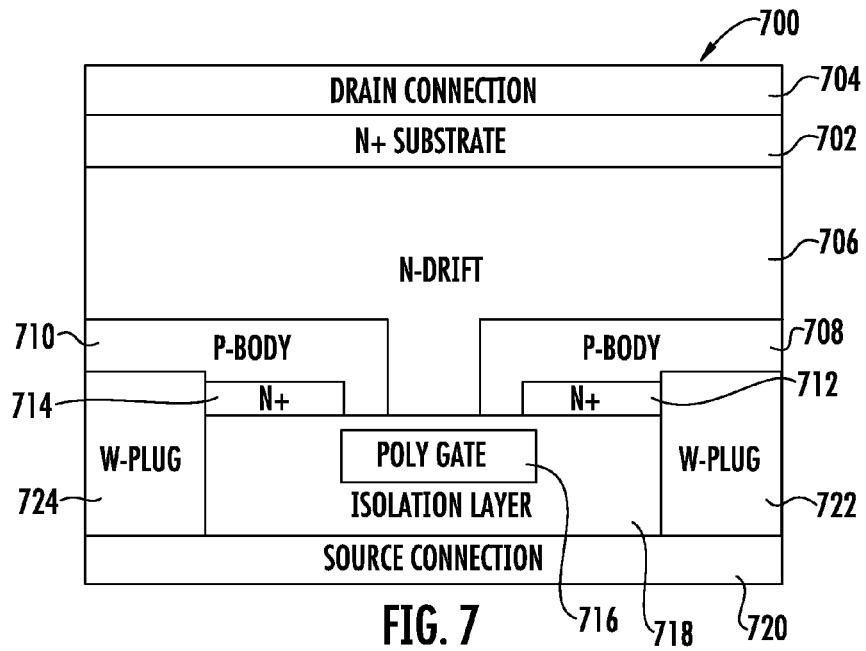
FIG. 7 is a side-elevation, cross-sectional view of an exemplary semiconductor device, which can be utilized to form a low-side transistor for a semiconductor voltage converter device in accordance with one embodiment of the present invention.

A low-side transistor 514 is attached to the upper surface of the ground lead frame 506 and a gate terminal (e.g., or lead frame) 517. The low-side transistor 514 can be a FET, such as, for example, a DMOS FET or other suitable transistor device. Note that, in one exemplary embodiment (referring below to FIG. 7), the low-side transistor 514 can be implemented using the "flipped" transistor (FET) 700 shown in FIG. 7, whereby after that die has been formed and flipped upside down (resulting in the configuration shown in FIG. 7), the gate and source connections are at or near the bottom of the device, and the drain connection is at or near its top. As such, returning to FIG. 5, the source 513 of the low-side transistor 514 is attached to the upper surface of ground lead frame 506. Also, the first (lower) surface of the first conductor unit 502a is attached to the drain 515 of the low-side transistor 514. In other words, the low-side transistor 514 is arranged in such a way that the source and gate connections are at or near one surface of the device, and the drain connection is at or near the opposite surface of the device. (A conventional orientation of such a die can be flipped so that the source and gate connections are at the bottom of the die and the drain connection is at the top, as shown in FIG. 7.) In any event, the source 511 of the high-side transistor 510 and the drain 515 of the low-side transistor 514 are connected to the phase output terminal 504 of the power stage of the voltage converter device via the first conductor unit 502a. A second lead wire 516 may electrically connect the gate terminal 517 (e.g., connected to the gate of the low-side transistor by a wire-bond connection) to a second driver output connection 520 of the driver/controller 508.

In operation, the first conductor unit 502a conducts the current from the source of the high-side transistor 510 and the drain of the low-side transistor 514 to the phase output lead frame 504. Also, the reduced-noise ground platform 500 insulates the phase output terminal 504 from the ground lead frame 506 and the ground terminal 518 of the voltage converter device, and the second (e.g., upper) surface of the second conductor unit 502b thus provides a reduced-noise grounded, structural platform or plane 522 for the driver/controller 508 (or, for example, one or more other components) of the voltage converter device involved.

Figure 6:
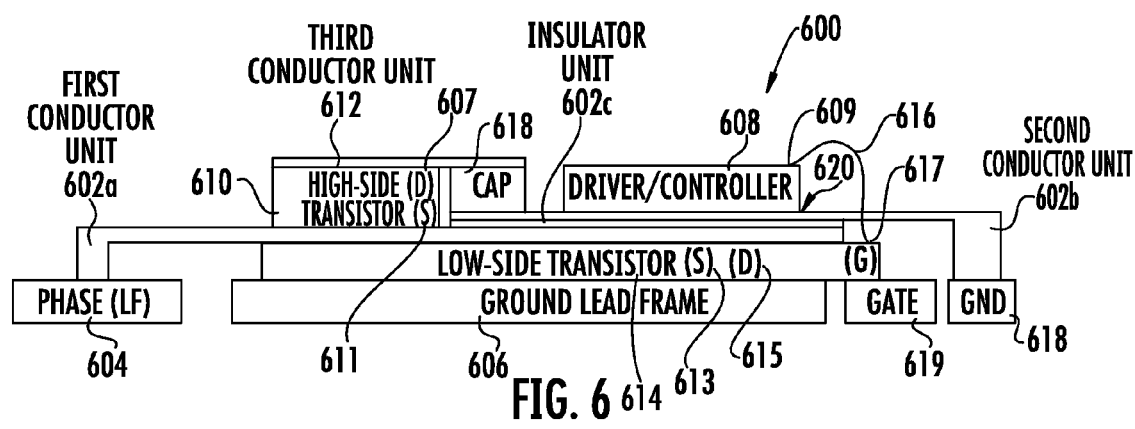
FIG. 6 is a side-elevation, cross-sectional view of a reduced-noise reference voltage platform for a voltage converter device, in accordance with a fifth exemplary embodiment of the present invention.

FIG. 6 is a side-elevation, cross-sectional view of a reduced-noise ground platform 600 for a voltage converter device, in accordance with a fifth exemplary embodiment of the present invention. Referring to FIG. 6, the reduced-noise ground platform 600 includes a first conductor unit 602a, a second conductor unit 602b, and an insulator unit 602c. The insulator unit 602c is a layer of a suitable insulation material sandwiched or interposed between a first (e.g., upper) surface of first conductor unit 602a and a second (e.g., lower) surface of second conductor unit 602b. For example, in one embodiment, first conductor unit 602a and second conductor unit 602b can be formed as separate components using a suitable electrically conductive material, such as copper or aluminum. The insulator unit 602c is formed using a suitable electrical insulation material, such as, for example, quartz or glass. The insulator unit 602c is permanently affixed to the first surface of the first conductor unit 602a and the second surface of the second conductor unit 602b using a suitable adhesive material (e.g., an epoxy). Note that although exemplary metallic, insulation and adhesive materials are described herein to form reduced-noise ground platform 600, the scope of the present invention is not intended to be so limited. Any suitable metallic, insulation or adhesive material or technique that can be used effectively in a semiconductor voltage converter device manufacturing process can be used to form the above-described components of the reduced-noise ground platform 600. In any event, the first conductor unit 602a of the reduced-noise ground platform 600 is connected at one end (e.g., using a suitable metal connection technique) to the phase output terminal 604 of the power stage of the voltage converter device, and the second conductor unit 602b of the reduced-noise ground platform 600 is connected at the other end (e.g., using a suitable metal connection technique) to a ground terminal (e.g., lead frame) 618 of the voltage converter device involved. For example, the ground terminal 618 can be an extension of ground lead frame 606 or a separate lead frame.

In this exemplary embodiment, a semiconductor driver/controller 608 is attached to a second (e.g., upper) surface of second conductor unit 602b. The substrate layer of the driver/controller 608 is at circuit ground and affixed to the second surface of second conductor unit 602b. Consequently, since the second conductor unit 602b is electrically connected to the ground terminal 618, the second conductor unit 602b forms a grounded platform or plane for driver/controller 608.

A high-side transistor 610 is attached to a second (e.g., upper) surface of first conductor unit 602a. For example, the high-side transistor 610 can be a FET, such as a LDMOS FET or other suitable transistor device. Note that (as described in detail above with respect to FIG. 3) the source connection 611 of the high-side transistor 610 is formed on the second (upper) surface of the first conductor unit 602a. A third conductor unit 612 (e.g., using a metal clip made of copper or aluminum) is formed on an upper surface of high-side transistor 610 and an upper surface of a capacitor 618. As such, the third conductor unit 612 electrically connects the drain 607 of the high-side transistor 610 to a first terminal of capacitor 618. The second terminal portion of the capacitor 618 is formed on the second surface of second conductor unit 602b and is electrically connected to the ground terminal 618. Also, the drain 607 of the high-side transistor 610 can be coupled to a Vin lead frame of the power stage involved using, for example, a suitable metal interconnection material or technique (e.g., a wire-bond connection or an extension of the third conductor unit 612).

A low-side transistor 614 is attached to the upper surface of the ground lead frame 606 and a gate terminal (e.g., or lead frame) 619. The low-side transistor 614 can also be a FET, such as, for example, a DMOS transistor device. Note that, in one exemplary embodiment (referring below to FIG. 7) the low-side transistor 614 can be implemented using the "flipped" transistor (FET) 700 shown in FIG. 7, whereby after that die has been formed and flipped upside down (resulting in the configuration shown in FIG. 7), the gate and source connections are at or near the bottom of the device, and the drain connection is at or near its top. As such, returning to FIG. 6, the source connection 613 of the low-side transistor 614 is arranged on the upper surface of ground lead frame 606. Also, the first (lower) surface of the first conductor unit 602a is arranged on the drain 615 of the low-side transistor 614. In other words, the low-side transistor 614 is arranged in such a way that the source and gate connections are at or near one surface of the device, and the drain connection is at or near the opposite surface of the device. (A conventional orientation of such a die can be flipped so that the source and gate connections are at the bottom of the die and the drain connection is at the top, as shown in FIG. 7.) In any event, the source 611 of the high-side transistor 610 and the drain 615 of the low-side transistor 614 are connected to the phase output terminal 604 of the power stage of the voltage converter device via the first conductor unit 602a. A lead wire 616 may electrically connect a gate 617 of the low-side transistor 614 to a driver output connection 609 of the driver/controller 608. The gate 617 is (e.g., wire-bond) connected to the gate terminal (e.g., pad) 619.

In operation, the first conductor unit 602a conducts the current from the source 611 of the high-side transistor 610 and the drain 615 of the low-side transistor 614 to the phase output terminal or lead frame 604. Also, the reduced-noise ground platform 600 insulates the phase output terminal 604 from the ground lead frame 606 and the ground terminal 618 of the voltage converter device, and the second (upper surface) of the second conductor unit 602b thus provides a reduced-noise grounded, structural platform or plane 620 for the driver/controller 608 (or, for example, one or more other components) of the voltage converter device involved. Additionally, in this exemplary embodiment, the capacitor 618 provides additional noise reduction between the Vin terminal and ground.

FIG. 7 is a side-elevation, cross-sectional view of an exemplary semiconductor device 700, which can be utilized to form a low-side transistor for a semiconductor voltage converter device in accordance with one embodiment of the present invention. In one embodiment, the semiconductor device 700 can be a vertical diffusion metal oxide semiconductor (VDMOS) device, such as a vertical N-channel DMOS device or a vertical P-channel DMOS device. For example, the semiconductor device 700 can be implemented as a VDMOS FET device.

Referring to FIG. 7, semiconductor device 700 includes a semiconductor substrate 702 doped to an N+conductivity (or alternatively, a P+conductivity in another embodiment) with a doping concentration of, for example, approximately 1E18 to 1E20 atoms/cm$^3$, and a drain connection layer 704 formed on the semiconductor substrate 702 with a doping concentration of, for example, approximately 1E18 to 5E20 atoms/cm$^3$. The substrate 702 is on an N-type drift region 706, which can be formed by epitaxy with a doping concentration of, for example, approximately 1E14 to 1E17 atoms/cm$^3$. The N-type drift region 706 is on and between a first P-body 708 and a second P-body 710. For example, the first P-body 708 and the second P-body 710 can be doped to a P-type conductivity with a doping concentration of, for example, approximately 1E14 to 1E18 atoms/cm$^3$. For example, the first and second p-body 708, 710 can be implanted, grown, deposited or attached to a surface of the N-type drift region 706. A first N+ region 712 and a second N+ region 714 are formed with a doping concentration of, for example, approximately 1E18 to 5E20 atoms/cm$^3$ on an isolation layer 718 (e.g., formed using a suitable dielectric material).

A conductive gate 716 is formed (e.g., using polysilicon) in the isolation layer 718, and a source connection layer 720 is formed under the lower surface of the isolation layer 718. For example, the source layer 720 can be formed with a doping concentration of approximately 1E18 to 5E20 atoms/cm$^3$. A first conductive trench 722 and a second conductive trench 724 including, for example, a Tungsten plug, are formed in the isolation layer 718. Note that, for this exemplary embodiment, the drain connection layer 704 is formed on the upper surface of the semiconductor device 700, the source connection layer 720 is formed on the lower surface of the semiconductor device 700, and the semiconductor device 700 can be used to form the low-side transistor shown in (and described below with respect to) FIG. 8. However, also note that although the semiconductor device shown in FIG. 7 can be utilized to implement a low-side transistor in the exemplary embodiment shown in FIG. 8, the present invention is not intended to be limited to a specific configuration and can also be implemented, for example, with any suitable transistor device having its drain at or near the upper surface and its source and gate at or near the lower surface of the device after it is flipped over (e.g., DMOS FET, trench FET, or shielded gate trench FET).

Figure 8:
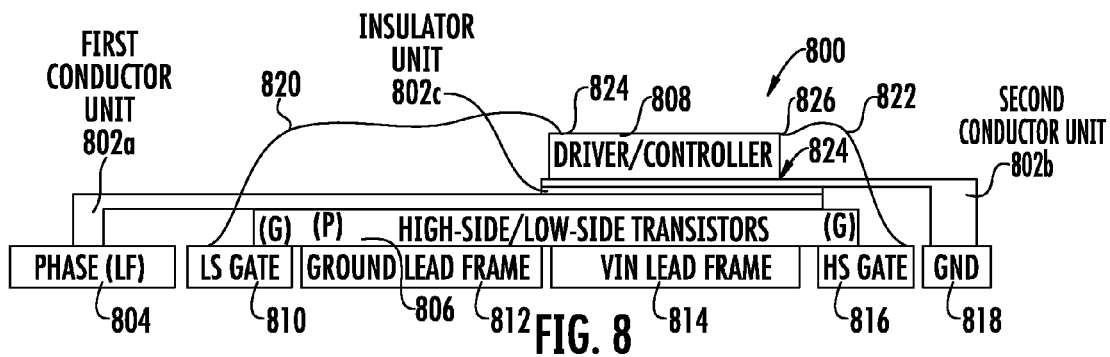
FIG. 8 is a side-elevation, cross-sectional view of a reduced-noise reference voltage platform for a voltage converter device, in accordance with a sixth exemplary embodiment of the present invention.

FIG. 8 is a side-elevation, cross-sectional view of a reduced-noise ground platform 800 for a voltage converter device, in accordance with a sixth exemplary embodiment of the present invention. Referring to FIG. 8, the reduced-noise ground platform 800 includes a first conductor unit 802a, a second conductor unit 802b, and an insulator unit 802c. The insulator unit 802c is a layer of a suitable insulation material sandwiched or interposed between a first (e.g., upper) surface of first conductor unit 802a and a second (e.g., lower) surface of second conductor unit 802b. For example, in one embodiment, first conductor unit 802a and second conductor unit 802b can be formed as separate components using a suitable electrically conductive material, such as copper or aluminum.

The insulator unit 802c is formed using a suitable electrical insulation material, such as, for example, quartz or glass. The insulator unit 802c is permanently affixed to the first surface of the first conductor unit 802a and the second surface of the second conductor unit 802b using a suitable adhesive material (e.g., an epoxy). Note that although exemplary metallic, insulation and adhesive materials are described herein to form reduced-noise ground platform 800, the scope of the present invention is not intended to be so limited. Any suitable metallic, insulation or adhesive material or technique that can be used effectively in a semiconductor voltage converter device manufacturing process can be used to form the above-described components of the reduced-noise ground platform 800. In any event, the first conductor unit 802a of the reduced-noise ground platform 800 is connected at one end (e.g., using a suitable metal connection technique) to the phase output terminal 804 of the power stage of the voltage converter device, and the second conductor unit 802b of the reduced-noise ground platform 800 is connected at the other end (e.g., using a suitable metal connection technique) to a ground terminal (e.g., lead frame) 818 of the voltage converter device involved.

In this exemplary embodiment, a semiconductor driver/controller 808 is attached to a second (e.g., upper) surface of second conductor unit 802b. The substrate layer of the driver/controller 808 is at circuit ground and affixed to the second surface of second conductor unit 802b. Consequently, since the second conductor unit 802b is electrically connected to the ground terminal 818, the second conductor unit 802b forms a grounded platform or plane for driver/controller 808.

In this exemplary embodiment, a semiconductor device or die 806 is attached to an upper surface of a low-side gate terminal (e.g., lead frame) 810, a ground lead frame 812, a Vin lead frame, 814, and a high-side gate terminal 816, and an upper surface of the semiconductor device or die 806 is attached to a portion of the second (e.g., lower) surface of the first conductor unit 802a. For this embodiment, the semiconductor device 806 includes a high-side transistor and a low-side transistor formed on a single die. The high-side transistor can be implemented using, for example, the LDMOS device depicted in FIG. 3, and the low-side transistor can be implemented using, for example, the VDMOS device depicted in FIG. 7. Note that the gate of the low-side transistor is connected (e.g., wire-bonded) to the low-side gate terminal 810, and the gate of the high-side transistor is connected (e.g., wire-bonded) to the high-side gate terminal 816. Also, the source of the high-side transistor and the drain of the low-side transistor are connected to the first conductor unit 802a and thus the phase output terminal 804. The drain of the high-side transistor is connected (e.g., wire-bonded) to the Vin lead frame 814. Note that the semiconductor device or die 806 is oriented so that the phase (p) connections (i.e., drain connection of the low-side transistor and source connection of the high-side transistor) are arranged at or near one (e.g., upper) surface of the semiconductor device 806, and the drain and gate connections of the high-side transistor and the source and gate connections of the low-side transistor are arranged at or near the opposite (e.g., lower) surface of the semiconductor device 806. In any event, a first lead wire 820 may electrically connect the low-side gate terminal 810 to a first driver output connection 824 of the driver/controller 808, and a second lead wire 822 may electrically connect the high-side gate terminal 816 to a second driver output 826 of the driver/controller 808.

Note that the reduced-noise ground platform 800 shown in FIG. 8 is not intended to limit the present invention to the exemplary embodiment shown. For example, any suitable semiconductor device can be used for semiconductor device 806, which has a low-side FET and a high-side FET on a single die, with the low-side source and gate connections, and the high-side drain and gate connections at or near one surface of the die, and the low-side drain connection and the high-side source connection connected together at or near the opposite surface of the die. For this example, the above-described die can be flipped over so that the low-side source and gate connections, and the high-side drain and gate connections are at or near the bottom of the die, and the low-side drain connection and high-side source connection are at or near the top of the die. The terminals or pads at the bottom of the semiconductor device can be connected to appropriate portions of a lead frame and electrically isolated from each other (e.g., via 810, 812, 814, 816). The terminals or pads at the top of the semiconductor device can be connected to a single phase lead frame (e.g., via 802a).

In operation, the first conductor unit 802a conducts the current from the source of the high-side transistor and the drain of the low-side transistor in the semiconductor device 806 to the phase output terminal (or lead frame) 804. Also, the reduced-noise ground platform 800 insulates the phase output terminal 804 from the ground terminal 818 of the voltage converter device, and the second (e.g., upper) surface of the second conductor unit 802b thus provides a reduced-noise grounded platform or plane 824 for the driver/controller 808 (or, for example, one or more other components) of the voltage converter device involved.

Figure 9:
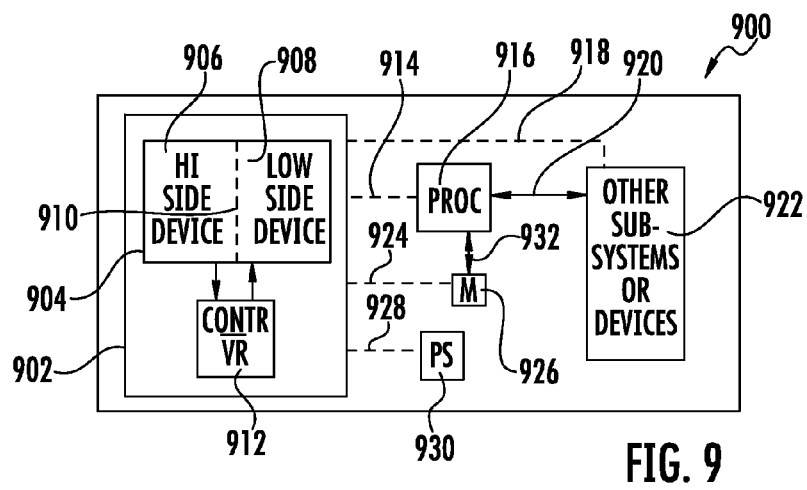
FIG. 9 is a schematic, block diagram of an exemplary system that can be utilized to implement a reduced-noise reference voltage platform for a voltage converter device, in accordance with one or more embodiments of the present invention.

FIG. 9 is a schematic, block diagram of an exemplary system 900 that can be utilized to implement a reduced-noise ground platform for a voltage converter device, in accordance with one or more embodiments of the present invention. Referring to FIG. 9 for one exemplary embodiment, system 900 includes a voltage converter device 902, such as, for example, a DC to DC power converter. The voltage converter device 902 includes a semiconductor device (or die) 904. The semiconductor device 904 includes a high-side transistor device 906 and a low-side transistor device 908. In one embodiment, the high-side and low-side transistors can be formed on a single semiconductor die. A reduced-noise ground platform 910 is formed adjacent to, and electrically coupled to, the high-side transistor device 906 and the low-side transistor device 908. The voltage converter device 902 also includes a second semiconductor device (or die) 912, which includes a driver/controller and voltage regulator to control the voltage converter device 902.

Exemplary system 900 also includes a processor 916 (e.g., microprocessor, microcontroller, embedded processor, digital signal processor, or a combination of the same), and one or more memory devices 926 (e.g., RAM, ROM, flash memory, or a combination of the same). Also included are other subsystems or devices, such as, for example, video cards, digital video disks, optical drives, and universal serial bus (USB) hardware to name a few. The voltage converter device 902 is powered by a power source or supply 930 through a first power bus 928. For example, the power source or supply 930 can be a DC power supply or battery. The processor 916 can be powered through a second power bus 914, the memory devices 926 can be powered through a third power bus 924, and the other subsystems or devices 922 can be powered through a fourth power bus 918. Data can be passed between the processor 916 and the other subsystems or devices 922 on a first data bus 920, and data can also be passed between the processor 916 and the memory 926 on a second data bus 932.

In the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that the present invention be limited only by the claims and the equivalents thereof.

What is claimed is:

1. A circuit device, comprising:
a first conductor unit;
a second conductor unit;
an insulator unit interposed between a first surface of the first conductor unit and a first surface of the second conductor unit;
a phase terminal connected to the first conductor unit; and
a reference voltage terminal connected to the second conductor unit, wherein the insulator unit electrically isolates the first conductor unit from the second conductor unit, and a second surface of the second conductor unit comprises a reduced-noise platform for a semiconductor device.

2. The circuit device of claim 1, further comprising a driver/controller arranged on the second surface of the second conductor unit.

3. The circuit device of claim 1, further comprising a driver/controller arranged on the second surface of the second conductor unit, and a substrate of the driver/controller connected to a circuit reference voltage.

4. The circuit device of claim 1, further comprising:
a first transistor arranged on the first surface of the first conductor unit; and
a second transistor arranged under a second surface of the first conductor unit.

5. The circuit device of claim 1, further comprising:
a first transistor arranged on the first surface of the first conductor unit; and
a second transistor arranged under a second surface of the first conductor unit, wherein the first transistor comprises a high-side power transistor in the voltage converter device, and the second transistor comprises a low-side power transistor in a voltage converter device.

6. The circuit device of claim 1, further comprising:
a first transistor arranged on the first surface of the first conductor unit; and
a second transistor arranged under a second surface of the first conductor unit, wherein a source of the first transistor and a drain of the second transistor are connected to the first conductor unit.

7. The circuit device of claim 1, further comprising:
a first transistor arranged on the first surface of the first conductor unit;
a second transistor arranged under a second surface of the first conductor unit; and
a driver/controller arranged on the second surface of the second conductor unit, wherein a first output of the driver/controller is connected to a gate of the first transistor, and a second output of the driver/controller is connected to a gate of the second transistor.

8. The circuit device of claim 1, further comprising:
a first transistor arranged on the first surface of the first conductor unit; and
a second transistor arranged under a second surface of the first conductor unit, wherein the first transistor and the second transistor comprise a field-effect transistor (FET).

9. The circuit device of claim 1, further comprising:
a first transistor arranged on the first surface of the first conductor unit; and
a second transistor arranged under a second surface of the first conductor unit, wherein the first transistor and the second transistor comprise a double-diffused metal-oxide semiconductor (DMOS) transistor.

10. The circuit device of claim 1, further comprising:
a first transistor arranged on the first surface of the first conductor unit; and
a second transistor arranged under a second surface of the first conductor unit, wherein the first transistor comprises a lateral DMOS (LDMOS) transistor and the second transistor comprises a vertical DMOS (VDMOS) transistor.

11. The circuit device of claim 1, further comprising:
a transistor arranged on the first surface of the first conductor unit;
a third conductor unit arranged on a second surface of the transistor; and
a capacitor connected at a first side to the third conductor unit and at a second side to the second surface of the second conductor unit.

12. The circuit device of claim 1, further comprising:
a first transistor arranged on the first surface of the first conductor unit;
a second transistor arranged under a second surface of the first conductor unit;
a ground lead frame; and
a gate terminal, wherein the second transistor is arranged on the ground lead frame and the gate terminal.

13. The circuit device of claim 1, further comprising:
a plurality of transistors;
a first gate terminal;
a second gate terminal;
a ground lead frame; and
a voltage input lead frame, wherein the plurality of transistors are arranged under the first conductor unit and over the first gate terminal, the second gate terminal, the ground lead frame, and the voltage input lead frame.

14. An electronic system, comprising:
a processor unit;
a memory unit coupled to the processor unit to pass data therebetween;
one or more electronic subsystems coupled to the processor unit to pass data therebetween; and a voltage converter device coupled to at least one of the processor, memory, and the one or more subsystems, wherein the voltage converter device comprises:

a high-side transistor;

a low-side transistor, wherein a source of the high-side transistor is coupled to a drain of the low-side transistor;

a controller coupled to a gate of the high-side transistor and a gate of the low-side transistor;

a first conductor unit;

a second conductor unit;

an insulator unit interposed between a first surface of the first conductor unit and a first surface of the second conductor unit;

a phase terminal connected to the first conductor unit; and a reference voltage terminal connected to the second conductor unit, wherein a second surface of the second conductor unit comprises a platform, and the controller is disposed on the platform and coupled to the reference voltage terminal.

15. The electronic system of claim 14, further comprising a power source coupled to the voltage converter device.

16. The electronic system of claim 14, wherein the voltage converter device comprises a DC to DC power converter device.

17. A voltage converter device, comprising:

a high-side transistor;

a low-side transistor, wherein a drain of the low-side transistor is coupled to a source of the high-side transistor;

a controller, wherein a first output of the controller is coupled to a gate of the high-side transistor, and a second output of the controller is coupled to a gate of the low-side transistor;

a first conductor unit;

a second conductor unit;

an insulator unit interposed between a first surface of the first conductor unit and a first surface of the second conductor unit;

an output phase terminal connected to the first conductor unit, the source of the high-side transistor, and the drain of the low-side transistor; and a reference voltage terminal connected to the second conductor unit and a source of the low-side transistor, wherein a second surface of the second conductor unit comprises a structural platform, and the controller is disposed on the platform and a circuit portion of the controller is thereby electrically coupled to the reference voltage terminal.

18. The voltage converter device of claim 17, wherein the first conductor unit comprises a first L-shaped conductor, and the second conductor unit comprises a second L-shaped conductor arranged with a different orientation than the first L-shaped conductor.

19. The voltage converter device of claim 17, wherein a portion of the first conductor unit is arranged under a portion of the second conductor unit.

20. The voltage converter device of claim 17, wherein the first conductor unit and the second conductor unit are partially overlapping units.

21. The voltage converter device of claim 17, wherein the high-side transistor is disposed on a portion of an upper surface of the first conductor unit, and the low-side transistor is disposed between a portion of a lower surface of the first conductor unit and the reference voltage terminal.

22. The voltage converter device of claim 17, wherein the reference voltage terminal is coupled to circuit ground.

23. The voltage converter device of claim 17, wherein the controller comprises a semiconductor driver/controller device.

24. The voltage converter device of claim 17, further comprising:

a capacitor electrically coupled between an input voltage of the voltage converter device and ground.

25. The voltage converter device of claim 24, further comprising a third conductor unit coupled to a drain of the high-side transistor and the input voltage, and the capacitor is disposed between the third conductor unit and ground.

26. The voltage converter device of claim 17, wherein the controller comprises a first semiconductor device, and the high-side transistor and the low-side transistor are arranged on a single die.

27. The voltage converter device of claim 17, wherein the high-side transistor and the low-side transistor comprise at least one semiconductor device.

* * * * *